United States Patent [19]

En

[11] 4,217,660
[45] Aug. 12, 1980

[54] METHOD AND APPARATUS FOR THE CODING AND DECODING OF DIGITAL DATA

[75] Inventor: John En, San Diego, Calif.

[73] Assignee: Motorola, Inc., Schaumburg, Ill.

[21] Appl. No.: 925,348

[22] Filed: Jul. 17, 1978

[51] Int. Cl.³ .......................................... G06F 11/10
[52] U.S. Cl. .................................................. 371/44
[58] Field of Search ........... 340/146.1 AQ, 146.1 AL, 340/146.1 A

[56] References Cited

U.S. PATENT DOCUMENTS

| 3,278,729 | 10/1966 | Chien | 340/146.1 AL |
|---|---|---|---|
| 3,508,197 | 4/1970 | Tong | 340/146.1 AQ |
| 3,585,586 | 6/1971 | Harmon et al. | 340/146.1 AQ |
| 3,652,998 | 3/1972 | Forney, Jr. | 340/146.1 A |
| 3,657,699 | 4/1972 | Rocher et al. | 340/146.1 A |
| 3,728,678 | 4/1973 | Tong | 340/146.1 AQ |
| 3,873,971 | 3/1975 | En | 340/146.1 AQ |
| 3,988,677 | 10/1966 | Fletcher et al. | 340/146.1 AQ |
| 4,055,832 | 10/1977 | En | 340/146.1 AQ |

OTHER PUBLICATIONS

Franco, Coding for Error-Free Communications, Electro-Technology, Jan. 1968, pp. 53, 55–62.
Peterson and Weldon, Error Correcting Codes, Second Edition, the MIT Press, 1972, pp. 427–435 and 440–445.

*Primary Examiner*—Charles E. Atkinson
*Attorney, Agent, or Firm*—James W. Gillman; James A. Scheer

[57] ABSTRACT

Digital information is convolutionally encoded and stored in row by successive row sequence in a storage matrix. The interleaved data from the matrix is outputted in column by successive column order for transmission over a medium.

The decoding process includes loading the encoded bit stream in column by successive column sequence in a decoder matrix. The stored data is then outputted in row by row sequence, thereby deinterleaving the bit stream. The original information bits are then regenerated by processing the bit stream through a convolutional decoder.

The instant data processing system is capable of correcting for one out of four successive random errors and burst errors having a length of one-fourth of the entire message.

10 Claims, 2 Drawing Figures

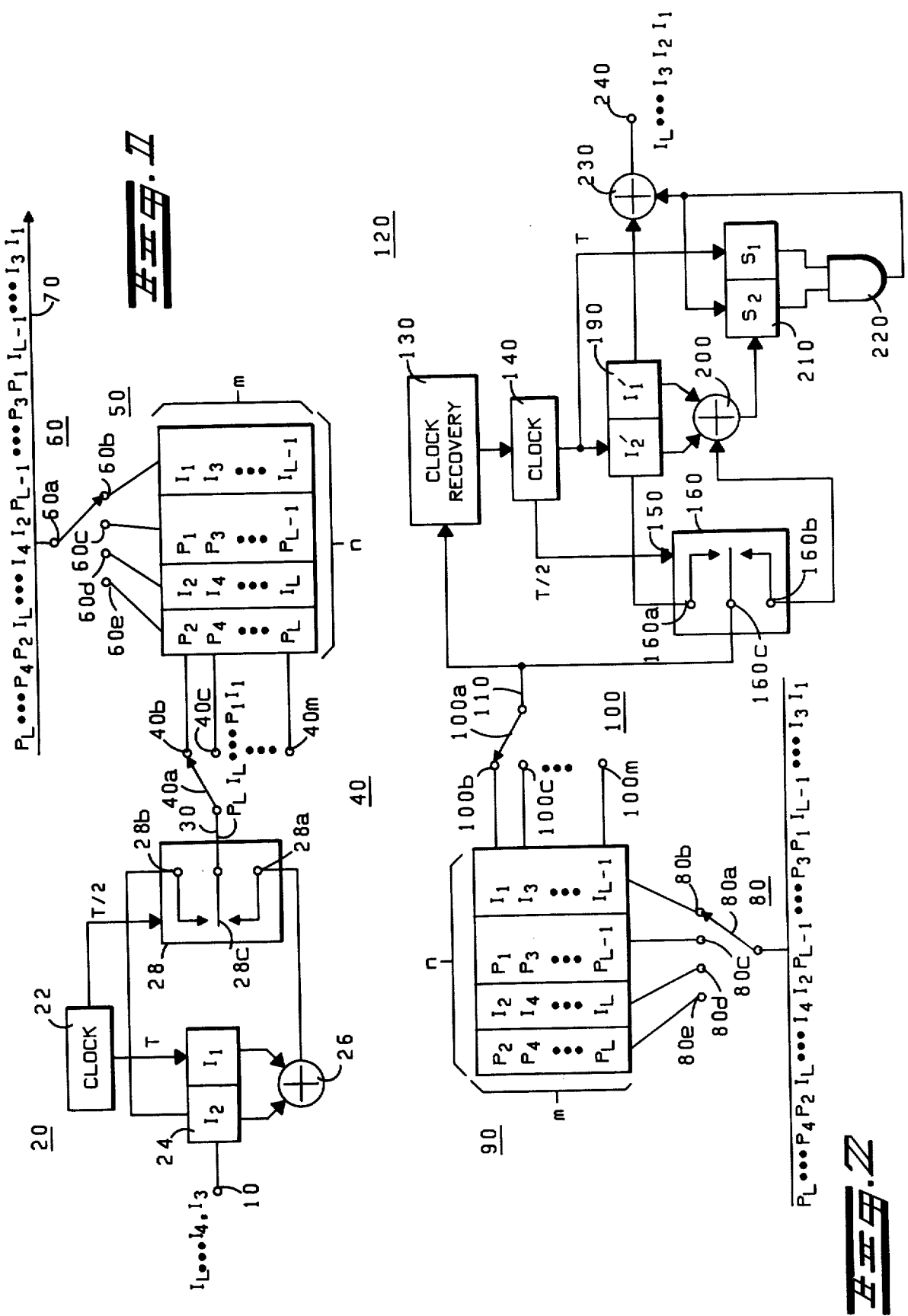

METHOD AND APPARATUS FOR THE CODING AND DECODING OF DIGITAL DATA

BACKGROUND OF THE INVENTION

This invention pertains to the digital data processing art and, more particularly, to an improved method and apparatus for correcting transmission errors of digital information bit streams.

Error correcting codes are well known, especially in the digital computer and digital data communication fields. Errors may occur whenever a stream of digital information bits, i.e. a sequence of logic "zero" or "one" levels, is transmitted over a channel subject to noise interference. Numerous techniques have been developed to encode the transmitted data such that errors occurring during transmission can be detected and corrected at the receiver site.

One example of a prior art approach is the BCH block code.

While the BCH block code is capable of error correction without the use of "stretch" bits it does not provide burst correction, it is not flexible in application and it requires a complex decoder.

Also, burst error correction convolutional codes have been developed. These systems all employ some "time diversity" scheme which "stretches" the entire message by the amount of the "time diversity". These stretch bits, when added to messages of short or moderate length may constitute a substantial portion, e.g. 50% to 90%, of the entire transmitted message thereby substantially increasing the overall message length and resulting transmission time.

Finally, one error correction convolutional codes have been developed which are capable of correcting random errors in a transmitted data bit stream. A randon error is distinguished from a burst error in that random errors affect single bits and are generally widely spaced. In a burst error, however, two or more successive bits are obliterated. Such convolutional codes are not capable of correcting burst type errors.

Thus, the prior art has felt a need for an error correction system which is capable of correcting both random and burst errors and which requires a minimum of transmission bits.

SUMMARY OF THE INVENTION

It is an object of this invention, therefore, to provide a method of and apparatus for the encoding and decoding of information bit streams, which method and apparatus are capable of burst and random error correction and which requires a minimum transmitted bit length.

Briefly, according to the invention, a method for encoding an information bit stream comprises the first step of convolutionally encoding the bit stream such that each information bit is followed by a predetermined parity bit. This convolved bit stream is then stored in accordance with a first predetermined sequence. The stored, convolved bit stream is outputted in accordance with a second predetermined sequence thereby generating the encoded bit stream.

Preferably, the convolved bit stream is stored in an m by n matrix of storage cells. Data bits in the convolved bit stream are stored in the matrix in a row by successive row sequence. The data in the matrix is outputted in a column by successive column sequence, thereby generating the encoded bit stream.

The decoding process involves storing the encoded data bits in a predetermined sequence and, preferably in a column by successive column sequence in a decoder m by n matrix. The data bits in the decoder matrix are then outputted in a row by successive row sequence thereby recovering the convolved bit stream. Finally, the convolved bit stream is convolutionally decoded in a provided convolutional decoder thereby recovering the information bit stream.

BRIEF DESCRIPTION OF THE DRAWINGS

FIG. 1 is a block diagram illustrating a preferred encoder, and method of encoding an information bit stream according to the instant invention; and FIG. 2 is a block diagram illustrating the decoder, and method of decoding according to the instant invention.

DETAILED DESCRIPTION OF THE PREFERRED EMBODIMENTS OF THE INVENTION

An encoder, and method for the encoding of an information bit stream according to the instant invention may be more fully understood with reference to FIG. 1 which is a preferred embodiment of the encoder apparatus. Here, an information bit stream, seen to comprise a total of L data bits, is shown being applied to the input 10 of the encoder. The origin of the data bits might be a computer terminal, an operator's keyboard, or other suitable source.

The input terminal 10 of the encoder is coupled to a rate one-half convolutional encoder 20. Convolutional encoder 20 is described in detail in U.S. Pat. No. 4,055,832, issued Oct. 25, 1977 and assigned to Motorola, Inc. In summary, the information data bits are clocked via a clock 22, having a period T, into an information bit register 24. Information bit register 24 is comprised of two storage cells for storing sequential information bits. These bits are modulo-2 added in a modulo-2 adder 26 and applied to one terminal 28a of a single pole double throw switch 28. Applied to the second input 28b of switch 28 is the present input information bit, appearing at the output from the first storage cell in the information bit storage register 24. The movable contact 28c of switch 28 is operated at a rate T/2 as controlled by the clock 22.

In operation, the modulo-2 adder 26 generates parity bits Pi equal to the modulo-2 sum of the successive information bits. The switch 28 is controlled by the clock 22 output, such that the output line 30 contains alternate information and parity bits thereby producing a convolved bit stream.

The convolved bit stream is coupled to the movable contact 40a of a multiposition switch, indicated generally at 40. The switch 40 is comprised of a plurality of stationary contacts 40b, 40c . . . 40m. Each of the stationary contacts connects to one row of a storage matrix, indicated generally at 50. Storage matrix 50 is comprised of m rows and n columns of storage cells. In this particular preferred embodiment of the invention, n is equal to 4 and m is increased to whatever size is necessary to store all of the convolved bit streams. In general, the product of m×n should be equal to or greater than the total number of bits in the convolved bit stream.

Each cell in the m by n matrix is capable of inputting, storing and outputting one of the convolved bits. In addition, once a row in the matrix 50 is completed, the movable contact 40a of switch 40 is incremented to fill the next successive row. Thus, the first four bits of the convolved bit stream, i.e., $I_1$, $P_1$, $I_2$ and $P_2$ are sequentially incremented to fill the first row of matrix 50. At this point the movable contact 40a moves to stationary contact 40c and the next row of the matrix is filled. In this manner, all m rows of the matrix 50 are filled.

The output from the matrix 50 is taken from a second multiposition switch, indicated generally at 60 which is comprised of movable contact 60a and four stationary contacts 60b-60e. Each of the stationary contacts 60b-60e is coupled to one of the n columns of the matrix 50.

Thus, in operation, the movable contact 60a is coupled to the first stationary contact 60b and the first column stored in the matrix is outputted. Following this, the movable contact 60a is switch to the second contact 60c, and the subsequent contacts until all of the data bits stored in the matrix are outputted in order. This produces the encoded data bit stream, indicated at the output line 70. As will be understood more fully hereinbelow, the novel approach of first convolutionally encoding, and then storing and outputting the convolved data bit streams in a predetermined sequence provides a means to correct for both burst and random errors occurring during transmission while utilizing a minimum number of encoded transmission bits.

The apparatus for, and method of decoding the encoded bit stream is illustrated in FIG. 2. Here, the encoded bit stream is coupled to the movable terminal 80a of a multiposition switch, indicated generally at 80. Switch 80 is comprised of four fixed contacts 80b-80e. Each stationary contact 80b-80e is coupled to one column of a decoder m by n matrix 90. As with the encoder storage matrix 50 in FIG. 1, the decoder storage matrix 90 is capable of inputting, storing and outputting each of the encoded data bits.

Thus, the first m data bits of the encoded bit stream are loaded into the first column of the decoder storage matrix 90 via movable contact 80a and fixed contact 80b. Thereafter, movable contact 80a is coupled to the second stationary contact 80c, and then to subsequent stationary contacts until the decoder storage matrix 90 is filled with the encoded data bit stream.

Outputs from the decoder storage matrix are taken via a multiposition switch, indicated generally at 100, comprised of a movable contact 100a and stationary contacts 100b-100m, each of which is coupled to a row of decoder storage matrix 90. Initially, movable contact 100a is coupled to the first stationary contact 100b of the decoder storage matrix 90 thereby outputting the first row of the storage matrix. Subsequently, successive rows of the matrix 90 are outputted via a movable contact 100a and the remaining stationary contacts. Thus, it can be seen that the bit stream appearing at the movable contact 100a of switch 100 is a recovered convolved bit stream generated by the convolutional encoder 20 of FIG. 1.

The convolved bit stream is fed to the input 110 of a convolutional decoder, indicated generally at 120. While a more detailed description of the operation of convolutional decoder 120 may be had by reference to the above referenced patent, basic operation of the convolutional decoder 120 may be understood as follows. Clock recovery circuitry 130 recovers the clock signal, having a period T as transmitted by the encoder of FIG. 1. The clock signals T and T/2 are then reproduced by a clock circuit 140. The clock signal of period T/2 is applied to the control input 150 of a single pole double throw switch 160. Switch 160 is comprised of fixed contacts 160a and 160b and a movable contact 160c. As shown, the recovered convolved bit stream is fed to the movable contact 160c of switch 160.

The first contact 160a of switch 160 connects to a two stage decoder information and storage register 190 controlled by the clock 140 signal of period T. The outputs from each of the storage register 190 cells are modulo-2 added, as is the signal appearing at the second contact 160b of the switch 160 in a modulo-2 adder 200. The output from modulo-2 adder 200 is coupled to a syndrome bit storage register 210. Syndrome register 210 is controlled by the clock signal of period T and has each of its stages fed through an AND gate 220. The output from AND gate 220 feeds back to the input cell of the syndrome register 210 and to one input of an output modulo-2 adder, 230, whose other input is fed from the output of the decoder information storage register 190. The output from the modulo-2 adder 230 comprises the output of 240 of the decoder.

In operation, the recovered convolved data bit stream is processed through the convolutional decoder 120, which then produces the information bit stream at its output 240. In the well known manner, the convolutional decoder 120 is capable of correcting one out of every four successive data bits. That is, if three successive data bits are correct, and the fourth is incorrect, the convolutional decoder 120 is capable of detecting and correcting the fourth bit.

The burst error correction capabilities of the instant encoding/decoding system may be understood with reference to the decoder storage matrix 90 of FIG. 2. Here, it should be observed that if part, or all of any one of the columns in the matrix are destroyed due to burst noise, the process of interleaved convolutional decoding in the row by successive row sequence will systematically correct each and every one of the errors in that column, due to the aforementioned one out of successive four correction capabilities. Thus, the instant system is capable of correcting burst errors have a length of one-fourth of the entire message.

In summary, an improved method and apparatus for the encoding and decoding of digital data has been described. The instant encoding/decoding scheme is capable of correcting both random and burst errors and requires a minimum bit stream length and, thus, a minimum of transmission time.

While a preferred embodiment of the invention has been described in detail, it should be apparent that many modifications and variations thereto are possible, all of which fall within the true spirit and scope of the invention.

I claim:

1. A method for encoding an information bit stream of L bits, $I_1 \ldots I_L$ and comprising the steps of:
    (a) convolutionally encoding said bit stream by generating parity bits $P_i$, where i is a integer from 1 to L and convolving the information and parity bits in a predetermined sequence;
    (b) providing a storage matrix having m columns and n rows of storage cells, where m and n are predetermined integers whose product m × n is at least as great as the total number of bits in the convolved bit stream, each cell being adapted to input, store and output one of said parity and information bits;
    (c) storing said convolved bit stream in said matrix in accordance with a predetermined row by row sequence;

(d) outputting said stored bit stream from said matrix in accordance with a predetermined column by column sequence such that the encoded bit stream is of the form $P_L \ldots P_4P_2I_1 \ldots I_4I_2P_{L-1} \ldots P_3P_1I_{L-1} \ldots I_3I_1$.

2. The method of claim 1 wherein step (a) further comprises the step of:
   (i) modulo-2 adding predetermined ones of the information bits to generate each parity bit, $P_i$.

3. The method of claim 1 or 2 wherein step (a) further comprises the step of:
   convolving the information and parity bits in the sequence $P_LI_L \ldots P_iI_i \ldots P_1I_1$.

4. The method of claim 1 in combination with the method of decoding said encoded bit stream comprising the steps of:
   (a') providing a decoder storage having m columns and n rows of storage cells, where m and n are predetermined integers whose product, $m \times n$, is as great as the total number of bits in said encoded bit stream each cell being adapted to input, store and output one of said encoded bits;
   (b') storing said encoded bit stream in said decoder storage matrix in accordance with a column by successive column sequence;
   (c') outputting said stored encoded bit stream in accordance with a row by successive row sequence to recover said convolved bit stream; and
   (d') convolutionally decoding said recovered convolved bit stream to regenerate said information bit stream.

5. An encoder for processing an information bit stream of length L, $I_L \ldots I_2I_1$, and generating an encoded bit stream comprising:
   convolutional encoder means for convolutionally encoding said information bit stream comprising means for generating parity bits $P_i$, where i is an integer from 1 to L, and means for predeterminedly convolving said parity bits with said information bits;
   storage matrix means, having m columns and n rows of storage cells, where m and n are predetermined integers whose product $m \times n$ is at least as great as the total number of bits in the convolved bit stream, each cell being adapted to input, store and output one of said parity or information bits, for storing said convolved bit stream in accordance with a row by successive row sequence;
   output means for outputting said stored bit stream from said matrix in a column by successive column sequence producing an encoded bit stream of the form $P_L \ldots P_4P_2I_L \ldots I_4I_2P_{L-1} \ldots P_3P_1I_{L-1} \ldots I_3I_1$.

6. The encoder of claim 5 wherein the convolutional encoder means for generating each parity bit further comprises:
   modulo-2 adder means for adding predetermined ones of the information bits to generate each parity bit $P_i$.

7. The encoder of claim 5 or 6 wherein said convolutional encoder means for predeterminedly convolving said parity bits further comprises:
   means for interleaving the information and parity bits in the sequence $P_LI_L \ldots P_iI_i \ldots P_1I_1$.

8. The encoder of claim 5 in combination with a decoder for decoding said encoded bit stream comprising:
   decoder storage matrix means having m columns and n rows of storage cells, where m and n are predetermined intergers whose product, $m \times n$, is as great as the total number of bits in said encoded bit stream, each cell being adapted to input, store and output one of said encoded bits;
   means for storing said encoded bit stream in said decoder storage matrix in accordance with a predetermined column by column sequence;
   means for outputting said stored encoded bit stream in accordance with a predetermined row by row sequence to recover said convolved bit stream; and
   means for convolutionally decoding said recovered convolved bit stream to regenerate said information bit stream.

9. An encoder for processing an information bit stream of length L, $I_L \ldots I_2I_1$, and generating an encoded bit stream comprising:
   convolutional encoder means for modulo-2 adding successive information bits to generate parity bits $P_i$, where i is an integer from 1 to L, and for interleaving the information and parity bits in the sequence $P_LI_L \ldots P_iI_i \ldots P_1I_1$, thereby generating a convolved bit stream.
   storage matrix means, having 4 columns and n rows of storage cells, where n is a predetermined integer, whose product $4 \times n$ is at least as great as the total number of bits in the convolved bit stream, each cell being adapted to input store and output one of said parity or information bits, for storing said convolved bit streams in a row by successive row sequence; and
   means for outputting said stored convolved bit stream from said matrix in a column by successive column basis producing an encoded bit stream of the form $P_L \ldots P_4P_2I_L \ldots I_4I_2P_{L-1} \ldots P_3P_1I_{L-1} \ldots I_3I_1$.

10. The encoder of claim 9 in combination with a decoder for decoding said encoded bit stream comprising:
    decoder storage matrix means having 4 columns and n rows of storage cells, each cell being adapted to input, store and output one bit of the encoded bit stream;
    means for storing said encoded bit stream in said decoder storage matrix in accordance with a predetermined column by column sequence;
    means for outputting said stored encoded bit stream in accordance with a predetermined row by row sequence to recover said convolved bit stream; and
    means for convolutionally decoding said recovered convolved bit stream to regenerate said information stream.

* * * * *